United States Patent [19]

Shigeno et al.

[11] Patent Number: 5,063,347

[45] Date of Patent: Nov. 5, 1991

[54] MAGNETIC SENSOR HAVING A BASE WITH MAGNETORESISTORS AND A MAGNET MOUNTED ON THE BASE

[75] Inventors: Yoshiharu Shigeno, Yokohama; Michihiro Murata, Kyoto; Yu Nishino, Ebina; Norio Fukui, Kyoto; Keizou Yamamoto, Osaka, all of Japan

[73] Assignee: Murata Mfg. Co., Ltd., Nagaokakyo, Japan

[21] Appl. No.: 498,169

[22] Filed: Mar. 23, 1990

[30] Foreign Application Priority Data

Mar. 31, 1989 [JP] Japan .................................. 1-38178[U]

[51] Int. Cl.$^5$ ...................... G01R 33/02; G01R 33/12; H01L 43/00; G01N 27/72
[52] U.S. Cl. .................................. 324/235; 324/252; 338/32 R
[58] Field of Search ................ 324/207.22, 235, 252; 338/32 R, 32 H; 360/113; 235/449, 450; 205/534, 567, 568; 29/603

[56] References Cited

U.S. PATENT DOCUMENTS 3,296,573 1/1967 Heid et al. ........................ 338/32 H

FOREIGN PATENT DOCUMENTS 0097115 8/1979 Japan .................................. 324/252

Primary Examiner—Walter E. Snow
Attorney, Agent, or Firm—Jordan and Hamburg

[57] ABSTRACT

A magnetic sensor includes magnetic sensor elements arrange on the upper surface of a bobbin and an input-/output section provided on the lower surface of the bobbin wherein the magnetic sensor elements and the input/output section are connected through a wiring pattern formed on the bobbin by electroless plating.

3 Claims, 2 Drawing Sheets

MAGNETIC SENSOR HAVING A BASE WITH MAGNETORSISTORS AND A MAGNET MOUNTED ON THE BASE

BACKGROUND OF THE INVENTION

1. Field of the Invention

This invention relates to a magnetic sensor, and more particularly to a magnetic sensor of a structure useful for forming a linear sense area by integrating a plurality of sensor elements.

2. Description of the Prior Art

A conventional magnetic sensor comprises a base made of resin, a magnetic resistance element provided on the upper surface of the bobbin, and terminal pins provided so as to penetrate the base. Input/output of signals can be carried out from the lower surface of the bobbin through these terminal pins. In addition, a magnet for providing a magnetic bias is provided below the magnetic resistance element.

The electric circuit of the abovementioned magnetic sensor serves as a voltage dividing circuit comprising two resistors connected in series to take out a signal from the junction thereof.

Depending upon its use, an approach is employed to integrally assemble a plurality of magnetic sensors as respective unit elements to provide a magnetic sensor in the form of a line sensor. Namely, a large number of magnetic sensors as unit elements are arranged and held within a linear holder. The magnetic sensor thus formed is attached onto a board or a base plate. A wiring pattern is formed on the board. Common terminal pins such as power supply lines, ground lines and the like of respective magnetic sensors are mutually connected. Further, output signal lines of the respective magnetic sensors are guided to a connector.

In another conventional magnetic sensor, a magnetic sensor is disclosed in Japanese Utility Model Application Laid Open No. 49466/1986.

The abovementioned conventional magnetic sensor is of a structure in which the terminal pins penetrate the base.

However, such a sensor has the problems that the work for penetrating or inserting the terminal pins through the base is troublesome, resulting in an increased number of manufacturing steps.

In addition, when assembling a large number of magnetic sensors as respective elements to form a linear magnetic sensor, the work of soldering individual magnetic sensor onto a board on which a wiring pattern is formed is required. Also in this case, there results the problem that the number of manufacturing steps is increased.

SUMMARY OF THE INVENTION

With the above in view, an object of this invention is to provide a magnetic sensor of a structure which requires no terminal pins and which has no need to solder individual magnetic sensors as respective elements onto a board in assembling a large number of magnetic sensors to form a linear magnetic sensor.

This invention provides a magnetic sensor including a magnetic sensor element arranged on the upper surface of a base and an input/output section provided on the lower surface of the base wherein a wiring pattern is formed on the base by electroless plating and the magnetic sensor element and the input/output section are connected through the wiring pattern.

In the above described configuration, the wiring pattern may be formed on the upper surface, the side surface or the lower surface of the base, or may use through holes.

In the magnetic sensor according to this invention, a wiring pattern is formed on the base itself by electroless plating, and the magnetic sensor elements on the upper surface of the base and the input/output section on the lower surface of the base are connected by the wiring pattern.

Thus, there is no need to penetrate the terminal pins, so the number of manufacturing steps is reduced accordingly. It is to be noted that while the number of steps for forming the wiring pattern on the base is increased, since the degree of a decrease in the manufacturing step resulting from the fact that no terminal pin is used is superior to the degree of the above increase in the manufacturing step, the total number of manufacturing steps is reduced.

Further, a plurality of magnetic sensor elements are provided in alignment on the base, resulting in a linear magnetic sensor. At this time, an arrangement is done such that common terminals such as power supply lines or ground lines of respective magnetic sensor elements are mutually connected and output signal lines of respective magnetic sensor elements are guided to the connector by the wiring pattern.

DESCRIPTION OF THE PREFERRED EMBODIMENTS

This invention will be described in more detail in accordance with preferred embodiments illustrated. It is to be noted that this invention is not limited by these embodiments.

FIGS. 1 to 6 show a linear magnetic sensor 1 of an embodiment according to this invention.

Figure 1:
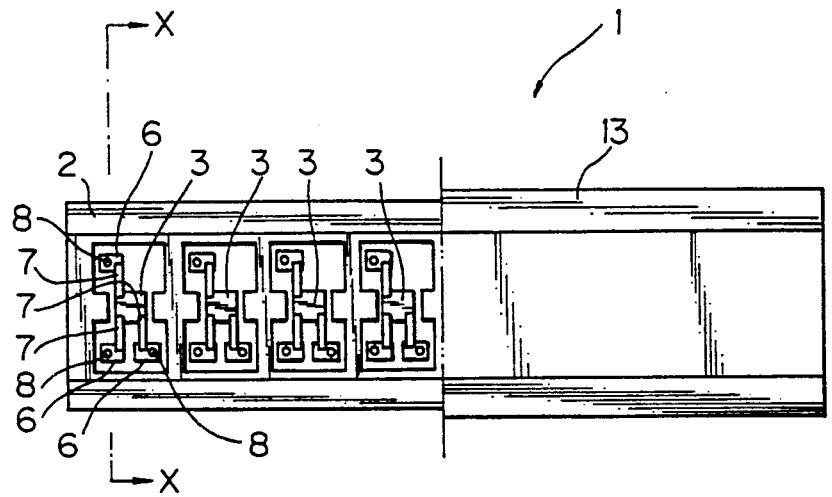
FIG. 1 is a plan view of a magnetic sensor of an embodiment according to this invention.

Initially referring to FIG. 1 illustrated as a plan view, the portion on the right side shows the state where the linear magnetic sensor 1 is covered with a nonmagnetic cover 13 and the portion on the left side shows the state where the cover 13 is removed therefrom.

On the upper surface of a base 2, a large number of magnetic resistance elements 3, 3, . . . are arranged in alignment and attached. Further, conductor patterns 6, 6, . . . are formed. These conductor patterns 6, 6, . . . are connected to the magnetic resistance elements 3, 3, . . . by means of frames 7, 7, . . . , respectively.

The conductor patterns 6, 6, . . . are provided therein with through holes 8, 8, . . . , respectively. These through holes 8, 8, . . . communicate with the lower surface of the base 2.

Figure 2:
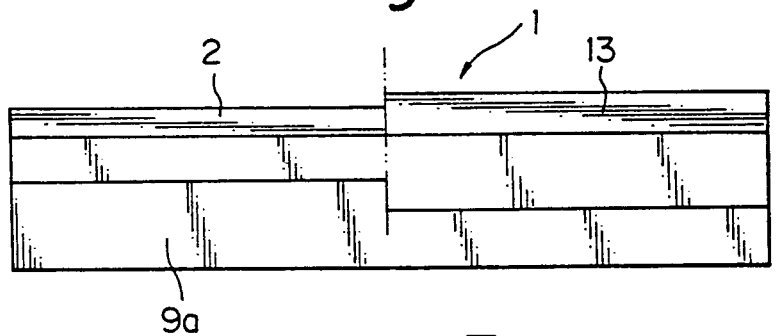
FIG. 2 is a front view of the magnetic sensor shown in FIG. 1.

FIG. 2 is a front view wherein the portion on the right side thereof shows the state where the magnetic sensor is covered with the cover 13 and the portion on the left side thereof shows the state where the cover 13 is removed therefrom.

Figure 5:
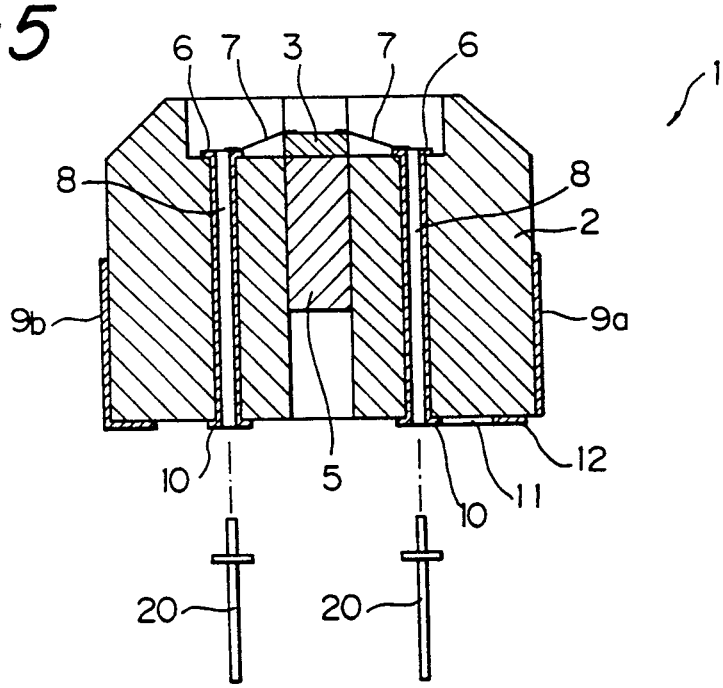
FIG. 5 is a cross sectional view taken along the line X—X of FIG. 1.

A conductor pattern 9a is formed also on the front surface. Further, a conductor pattern 9b is formed on the back as shown in FIG. 5. These conductor patterns 9a and 9b serve as a shield against external noises and as a charge preventive member.

Figure 3:
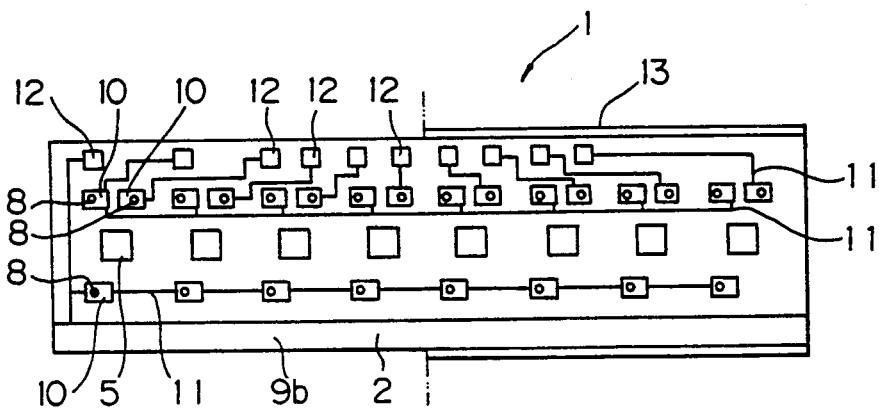
FIG. 3 is a bottom view of the magnetic sensor shown in FIG. 1.

As seen from the bottom view of FIG. 3, conductor patterns 10, 10, . . . with which the through holes 8, 8, . . . communicate are formed. Further, there are formed conductor patterns 12, 12, . . . arranged so that they are adapted to connecting portions of a connector (not shown) or arranged so that they are adapted to surface mounting onto a circuit board. Those conductor patterns are connected to corresponding conductor patterns 10, 10, . . . through conductor patterns 11, 11, . . . for connecting. In FIG. 3, reference numeral 5 denotes a magnet.

Figure 4:
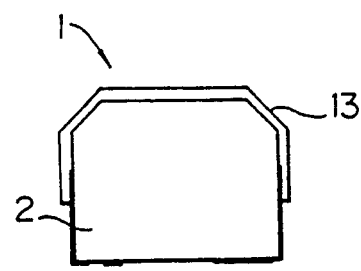
FIG. 4 is a side view of the magnetic sensor shown in FIG. 1.

FIG. 4 is a side view.

FIG. 5 is a cross sectional view taken along the line X—X in FIG. 1. Pins 20, 20, . . . can be inserted into through holes 8, 8, . . . , respectively. Thus, the higher order of compatibility with a conventional magnetic sensor using terminal pins is maintained. In this instance, since it is sufficient to allot two terminal pins to the power supply lines and the ground lines, respectively, the total number of terminal pins 20, 20, . . . can be reduced.

Figure 6:
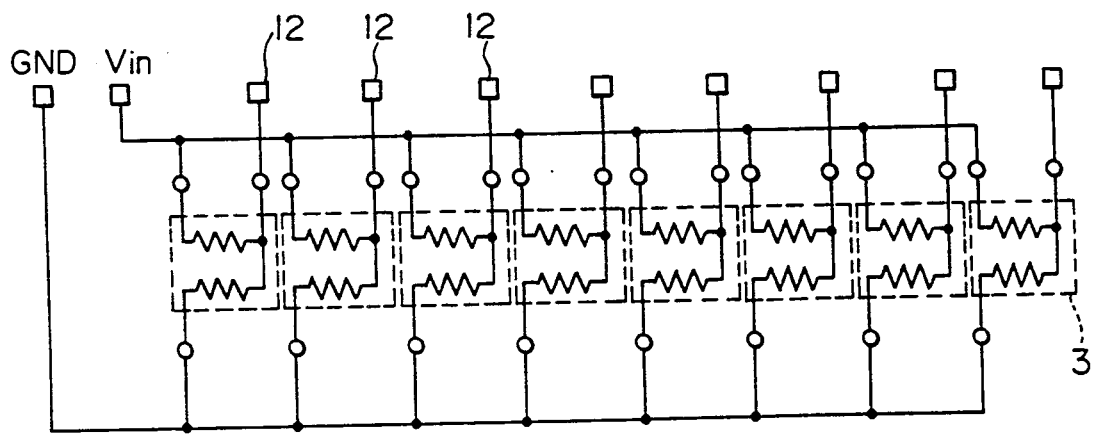
FIG. 6 is a circuit diagram of the magnetic sensor shown in FIG. 1.

FIG. 6 is a circuit diagram of the abovementioned magnetic sensor 1.

With the abovementioned magnetic sensor 1, the advantages described below can be provided.

(1) Since no terminal pin is required, the number of manufacturing steps can be reduced.

(2) Since the wiring patterns are formed on the base itself, in assembling a plurality of magnetic sensors to constitute a magnetic sensor formed as a line sensor, any additional board for wiring is not required and the number of manufacturing steps can be reduced. In addition, since the power supply lines can be commonly connected, wiring portions connected to the external can be also reduced.

(3) Since the pattern can be utilized as a shield or a charging preventive member, reliability can be improved.

(4) In very small magnetic sensor elements, their terminal pitches are extremely short. However, since such a terminal pitch can be converted to a desired pitch by the wiring pattern on the base, there is no need to additionally provide a board for conversion.

(5) Since this magnetic sensor has a linear sense area, it is useful as a sensor for a paper money discrimination machine.

What is claimed is:

1. In a magnetic sensor including a magnetic sensor element arranged on the upper surface of a base, and an input/output section provided on the lower surface of said base, the improvement wherein said sensor element is comprised of a pair of serially connected magnetic resistances, a wiring pattern is formed on said base by electroless plating, and that said magnetic sensor element and said input/output section are connected through said wiring pattern, and further comprising a hole extending through said base and a magnet in said hole aligned with said magnetic sensor element, said magnetic sensor having a nonmagnetic cover.

2. A magnetic sensor as set forth in claim 1, wherein said base is comprised of an elongated member and includes a plurality of magnetic resistance elements arranged in line on the upper surface of said base, said wiring pattern formed by electroless plating on said base mutually connecting said plurality of magnetic resistance elements.

3. The magnetic sensor of claim 1 comprising conductor means extending through said base, wherein said wiring pattern comprises means connecting said magnetic sensing element to one end of said conductor means.

* * * * *